(12) United States Patent
Gao et al.

(10) Patent No.: US 9,532,449 B2
(45) Date of Patent: Dec. 27, 2016

(54) DOUBLE-SIDED PATTERNED TRANSPARENT CONDUCTIVE FILM AND METHOD FOR MANUFACTURING THE SAME

(71) Applicant: NANCHANG O-FILM TECH. CO., LTD., Nanchang, Jiangxi (CN)

(72) Inventors: Yulong Gao, Nanchang (CN); Zheng Cui, Suzhou (CN); Hongwei Kang, Nanchang (CN)

(73) Assignee: Nanchang O-Film Tech. Co., Ltd., Nanchang (CN)

( * ) Notice: Subject to any disclaimer, the term of this patent is extended or adjusted under 35 U.S.C. 154(b) by 553 days.

(21) Appl. No.: 14/000,186

(22) PCT Filed: Dec. 20, 2012

(86) PCT No.: PCT/CN2012/087076
§ 371 (c)(1),
(2) Date: Aug. 16, 2013

(87) PCT Pub. No.: WO2013/166839
PCT Pub. Date: Nov. 14, 2013

(65) Prior Publication Data
US 2015/0289370 A1  Oct. 8, 2015

(30) Foreign Application Priority Data

May 9, 2012 (CN) .......................... 2012 1 0141850

(51) Int. Cl.
*H05K 1/11* (2006.01)
*H01L 31/0224* (2006.01)
*H01L 31/18* (2006.01)
*H05K 1/02* (2006.01)
(Continued)

(52) U.S. Cl.
CPC ......... *H05K 1/11* (2013.01); *H01L 31/022466* (2013.01); *H01L 31/1884* (2013.01);
(Continued)

(58) Field of Classification Search
CPC .......... H05K 1/11; H05K 3/06; H05K 3/1258; H05K 2203/0545; H05K 1/092; H05K 2203/0514; H05K 2201/09681; H05K 3/107; H05K 2201/09036; H05K 2201/0108; H05K 1/021; H05K 1/0212; H05K 1/0215; H05K 1/023; H05K 1/0231; H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162; H05K 1/165; H05K 1/181; H05K 1/182; H05K 1/183; H05K 1/184; H05K 1/185; H05K 2201/0317; H05K 2201/041; H05K 2201/049; H05K 2201/09763; H05K 2201/09872; H05K 2201/10446; H05K 2201/10454; H05K 2201/10462; H05K 2201/10469; H01L 31/022466; H01L 31/1884
See application file for complete search history.

(56) References Cited

U.S. PATENT DOCUMENTS

| | | | | |
|---|---|---|---|---|
| 4,948,706 A | * | 8/1990 | Sugihara | G02F 1/133512 216/101 |
| 7,985,527 B2 | * | 7/2011 | Tokunaga | H05K 3/106 430/270.1 |
| 2011/0099805 A1 | * | 5/2011 | Lee | G06F 3/044 29/846 |

FOREIGN PATENT DOCUMENTS

| CN | 101561729 A | 10/2009 |
|---|---|---|
| CN | 102222538 A | 10/2011 |

* cited by examiner

*Primary Examiner* — Ishwarbhai B Patel
(74) *Attorney, Agent, or Firm* — James F. Hann; Haynes Beffel & Wolfeld LLP

(57) ABSTRACT

A double-sided patterned transparent conductive film includes an upper surface conductive layer (12) and a lower surface conductive layer (12). The upper surface conductive layer is a patterned trench network; the lower surface conductive layer is a full-surface trench network. A trench of the upper surface conductive layer is filled with conductive (Continued)

material (13), and a trench of the lower surface conductive layer is intermittently filled with conductive material (13). The double-sided patterned transparent conductive film has a high resolution, transmittance, independently adjustable square resistance and many other advantages, such that the transparent conductive film saves a cost of PET. According to the manufacturing method, the alignment is not needed for double-sided imprinting of a single flexible substrate, thus the process is simple, low cost, advantageous for industrial production.

3 Claims, 3 Drawing Sheets

(51) Int. Cl.
    *H05K 3/06*          (2006.01)
    *H05K 3/12*          (2006.01)
    *H05K 3/10*          (2006.01)
    *H05K 1/09*          (2006.01)

(52) U.S. Cl.
    CPC ............. *H05K 1/0274* (2013.01); *H05K 3/06* (2013.01); *H05K 3/1258* (2013.01); *H05K 1/092* (2013.01); *H05K 3/107* (2013.01); *H05K 2201/0108* (2013.01); *H05K 2201/09036* (2013.01); *H05K 2201/09681* (2013.01); *H05K 2203/0514* (2013.01); *H05K 2203/0545* (2013.01); *Y02E 10/50* (2013.01); *Y10T 29/49155* (2015.01)

DOUBLE-SIDED PATTERNED TRANSPARENT CONDUCTIVE FILM AND METHOD FOR MANUFACTURING THE SAME

FIELD OF THE INVENTION

The present invention relates to transparent conductive film and preparation techniques, and more particularly relates to a double-sided patterned transparent conductive film and a manufacturing method thereof.

BACKGROUND OF THE INVENTION

The transparent conductive film is a sheet having a good electrical conductivity and a high transmittance in the visible light. Currently, the transparent conducting films have been widely used in the fields such as flat panel displays, photovoltaic devices, touch panels, and electromagnetic shielding, thus having a very broad market space.

ITO has dominated the market of the transparent conductive film. In most practical applications, such as touch screens, the former often requires exposure, imaging, etching and cleaning processes to pattern the transparent conductive film before use. Comparing to that, using a printing method or a silver salt method to form a metal grids directly on the specified region of the substrate can omit the patterning process, thus it has some advantages such as low pollution, low cost, etc. The patterned flexible transparent conductive films with excellent performance have been acquired using printing method by Japanese companies Dai Nippon Printing, Fujifilm and Gunze, as well as German company PolyIC. Among them, the film obtained by PolyIC has a graphics resolution of 15 µm, a surface square resistance of 0.4-1 Ω/sq, and a light transmittance exceeding 80%.

A transparent conductive film based on embedded patterned metal grid is disclosed, and the transparent conductive film with a PET substrate has a transmittance exceeding 87%; the transparent conductive film with a glass substrate has a transmittance exceeding 90%, and a surface square resistance less than 10 Ω/sq; especially for those having a resolution of metal lines less than 3 µm. However, in order to further reduce costs and make the touch module thinner, many touch screen manufacturers currently has pay more attention on the development of double-sided patterned transparent conductive film.

The trenches of the conventional embedded patterned transparent conductive film are formed by imprint techniques. Therefore, in order to prepare the double-sided patterned transparent conductive film, it is essential to develop a large format roll-to-roll double-sided aligned imprint technique, which, however, is currently far from mature.

Therefore, it is desire to provide a double-sided patterned transparent conductive film which can avoid alignment problems caused by double-sided imprinting.

SUMMARY OF THE INVENTION

In one aspect of the present invention, a double-sided patterned transparent conductive film and a manufacturing method thereof are provided to solve the technical problem in the prior art that roll-to-roll imprinting process requires two-sided alignment.

The technical solution of the present invention is achieved by the following embodiments.

A double-sided patterned transparent conductive film includes an upper surface conductive layer and a lower surface conductive layer. The upper surface conductive layer is a patterned trench network; the lower surface conductive layer is a full-surface trench network. A trench of the upper surface conductive layer is filled with conductive material, and a trench of the lower surface conductive layer is intermittently filled with conductive material.

In addition, the trench network is a trench combination using a polygon trench as a basic unit, wherein a shape of the basic unit is selected from the group consisting of square, rectangular, round, regular hexagonal, regular triangle, and a combination thereof.

In a preferred embodiment, the conductive material intermittently filled in the trench of the lower surface conductive layer appears intermittently in the trench of the lower surface conductive layer by patterning technology.

In a preferred embodiment, the trench network of the upper surface conductive layer of the double-sided patterned transparent conductive film has at least two network densities.

In a preferred embodiment, at least one network of the network densities has a relative transmittance exceeding 90%; at least one network has a relative transmittance less than 80%.

In a preferred embodiment, a relative transmittance of the trench network of the lower surface conductive layer of the double-sided patterned transparent conductive film exceeds 90%.

A method of manufacturing a double-sided patterned transparent conductive film includes the following steps:

step one, defining a patterned trench network on an upper surface of a intermediate layer by imprint technique;

step two, defining a full-surface trench network on a lower surface of the intermediate layer by imprint technique;

step three, filling conductive material in the trenches on the upper surface and the lower surface of a intermediate layer, respectively; and step four, patterning the unpatterned trench network of the lower surface filled with conductive material according to an alignment mark on the upper surface.

In a preferred embodiment, the imprint technique is hot imprint or UV imprint.

In a preferred embodiment, the alignment mark on the upper surface is an area of the upper surface having a larger network density, which serves as the alignment mark for the patterning the trench network of the lower surface; at least one network of the network density has a relative transmittance exceeding 90%, and at least one network has a relative transmittance less than 80%.

In a preferred embodiment, the patterning of the unpatterned trench network of the lower surface filled with conductive material includes: attaching a negative dry film to the lower surface; aligning the alignment mark on the upper surface with an alignment mark of a photosensitive film; exposing the negative dry film by UV; developing the negative dry film in a developer, such that the exposed area is preserved during the developing process and the unexposed area is removed, the covered conductive material is exposed;

immersing the double-sided transparent conductive film in an etching solution for the conductive material to remove the exposed conductive material; and immersing the double-sided transparent conductive film in a remover to remove the negative dry film and to expose the conductive layer.

In a preferred embodiment, the conductive material is filled by scrape coating or inkjet printing.

Advantageous Effects (1) The double-sided patterned transparent conductive film according to the present invention has a high resolution, transmittance, independently adjustable square resistance and many other advantages, such that the transparent conductive film saves a cost of PET.

(2) According to the manufacturing method, the alignment is not needed for double-sided imprinting of a single flexible substrate, thus the process is simple, low cost, advantageous for industrial production.

BRIEF DESCRIPTION OF THE DRAWINGS

The components in the drawings are not necessarily drawn to scale, the emphasis instead being placed upon clearly illustrating the principles of the present invention. It should be understood that the invention is not intended to be limited to the precise arrangements and instrumentalities shown.

DETAILED DESCRIPTION

Figure 1:
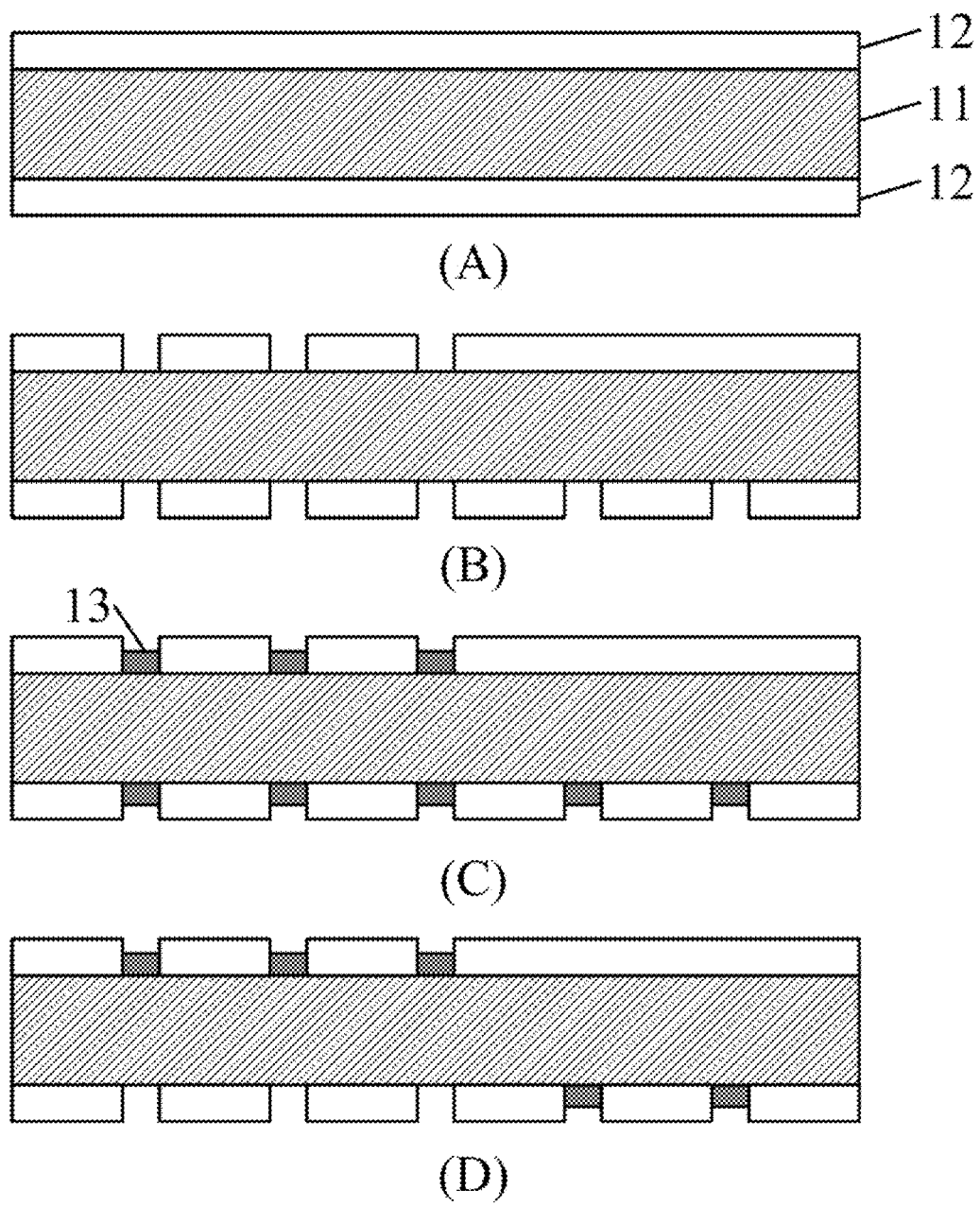
FIG. 1 is a schematic view of a double-sided patterned transparent conductive film according to the present invention.

The invention will be described in further detail below in conjunction with the drawing. It will be appreciated by those skilled in the art, though, that various changes and modifications can be made without departing from the invention.

Embodiment One

Figure 2:
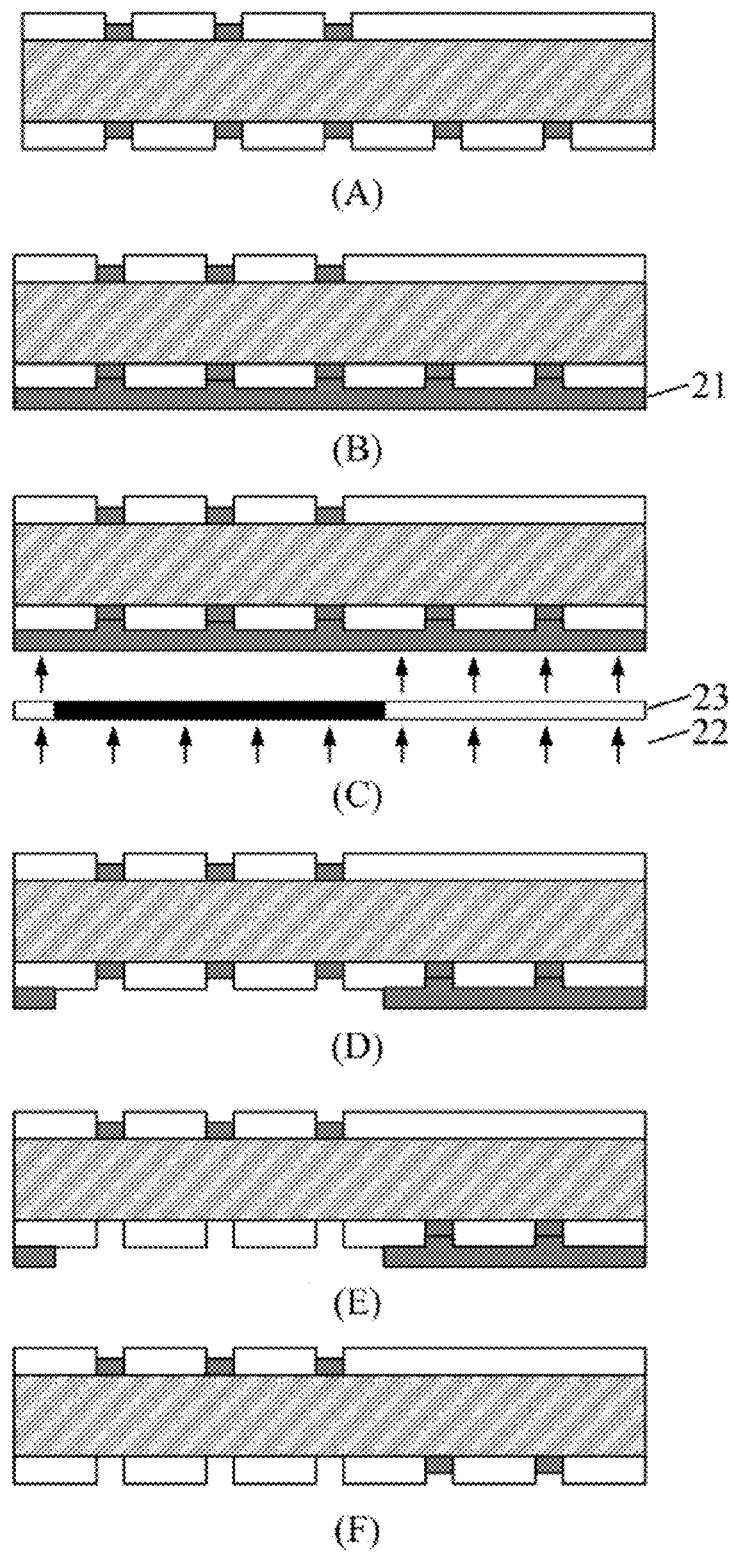
FIG. 2 is a schematic view showing the patterning process of the lower surface of the double-sided patterned transparent conductive film according to the present invention.

Referring to FIG. 2(F), an embodiment of a double-sided patterned transparent conductive film includes an upper surface conductive layer and a lower surface conductive layer, the upper surface conductive layer of the double-sided patterned transparent conductive film is a patterned trench network, and the lower surface conductive layer is a full-surface trench network. A trench of the upper surface conductive layer is filled with conductive material, and a trench of the lower surface conductive layer is intermittently filled with conductive material.

The trench network of the upper surface conductive layer of the double-sided patterned transparent conductive film has two network densities, one network has a relative transmittance of 90%; the other network has a relative transmittance of 80%. A relative transmittance of the trench network of the lower surface conductive layer of the double-sided patterned transparent conductive film is 90%.

Figure 3:
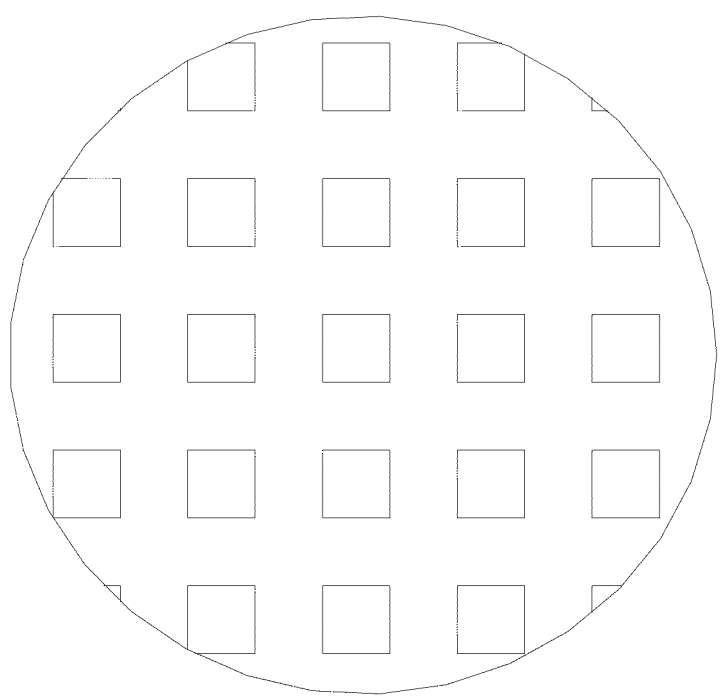
FIG. 3 is a simplified plan view of a trench network having a square basic unit.

Referring to FIG. 1(A), a UV imprint adhesive 12 is coated on the two surface of the substrate PET 11. Two surfaces of the PET 11 are configured with tackifier layer or dealt with tackifier and the PET 11 has a thickness of 125 μm. The UV imprint adhesive 12, which is H450 Tex, has a thickness of 4 μm. Referring to FIG. 1(B), a patterned trench network is defined on an upper surface 12 by upper trenches with imprint technology; a full-surface unpatterned trench network is defined on a lower surface 12 by lower trenches with a trench depth of 2 μm and a width of 2 μm. Referring to FIG. 1(C), the nano-silver ink 13 is filled in the trenches on the upper surface and the lower surface by scrape coating and then is sintered. The solid content of the silver ink is 35%. The sintering temperature is 135° C. Referring to FIG. 1(D), according to an alignment mark on the upper surface, the silver in the trench network of the lower surface is patterned. FIG. 3 is a simplified plan view of a trench network having a square basic unit.

The patterning technology of the lower surface is a very mature technology in the art, which will not be described in details. The following is described as an example.

Referring to FIG. 2(A), the lower surface is a full-surface trench network filled with conductive material; the upper surface is a patterned trench network filled with conductive material.

Referring to FIG. 2(B), a negative dry film 21, which is DuPont1505, is attached to the lower surface. Referring to FIG. 2(C), the alignment mark on the upper surface is aligned with an alignment mark of a photosensitive film 23, and the negative dry film 21 is then exposed by ultraviolet light. Referring to FIG. 2(D), the exposed area is preserved during the developing process while the unexposed area is removed, thus the silver covered by the negative dry film 21 is exposed. The developer is $Na_2CO_3$ solution with a mass percentage of 1%. Referring FIG. 2(E), the double-sided transparent conductive film is immersed in a silver etching solution to remove the exposed silver. Referring to FIG. 2(F), the double-sided transparent conductive film is immersed in a remover to remove the negative dry film and to expose the protected silver. The remover is $Na_2CO_3$ solution with a mass percentage of 2%.

The intermediate layer of the double-sided transparent conductive film of Embodiment One is not limited to the materials described above, it may be glass, quartz, polymethyl methacrylate (PMMA), polycarbonate (PC), etc. The patterning technology of the lower surface is no limited to the process described above; other technology can be implemented as long as it can pattern the lower surface. The imprint technique may include hot imprint or UV imprint. The conductive material may be filled by scrape coating or inkjet printing. The conductive material of the present invention is not limited to silver, e.g. it may be graphite, polymer conductive materials, and the like.

Although the invention has been described in language specific to structural features and/or methodological acts, it is to be understood that the invention defined in the appended claims is not necessarily limited to the specific features or acts described. Rather, the specific features and acts are disclosed as sample forms of implementing the claimed invention.

What is claimed is:

1. A double-sided patterned transparent conductive film, comprising:
    a transparent intermediate layer;
    an upper imprint adhesive layer and an lower imprint adhesive layer coated on opposing surfaces of the transparent intermediate layer;
    the upper imprint adhesive layer being provided with upper trenches defining a patterned trench network; and
    the lower imprint adhesive layer being provided with lower trenches defining a full-surface trench network;
    wherein all of the upper trenches of the patterned trench network are filled with conductive material, and only some of the lower trenches of the full-surface trench network are filled with conductive material.

2. The double-sided patterned transparent conductive film according to claim 1, wherein the conductive material filled in said some of the trenches of the full-surface trench network is carried out by patterning technology.

3. The double-sided patterned transparent conductive film according to claim 1, wherein a relative transmittance of the trench network of the lower surface conductive layer of the double-sided patterned transparent conductive film exceeds 90%.

\* \* \* \* \*